(12) United States Patent
Hsieh et al.

(10) Patent No.: US 12,426,385 B2
(45) Date of Patent: Sep. 23, 2025

(54) SEMICONDUCTOR DEVICE AND METHOD FOR FABRICATING THE SAME

(71) Applicant: UNITED MICROELECTRONICS CORP., Hsin-Chu (TW)

(72) Inventors: Po-Kuang Hsieh, Kaohsiung (TW); Shih-Hung Tsai, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 519 days.

(21) Appl. No.: 17/953,309

(22) Filed: Sep. 26, 2022

(65) Prior Publication Data

US 2024/0072097 A1   Feb. 29, 2024

(30) Foreign Application Priority Data

Aug. 25, 2022 (TW) .................................. 111132017

(51) Int. Cl.
*H10F 39/00* (2025.01)

(52) U.S. Cl.
CPC ......... *H10F 39/026* (2025.01); *H10F 39/016* (2025.01); *H10F 39/811* (2025.01)

(58) Field of Classification Search
CPC .... H10F 39/811; H10F 39/016; H10F 39/026; H10F 39/8023; H10F 39/182; H10F 39/8053; H10F 39/8063; H10B 12/053; H10B 12/50; H10B 20/25; H10B 12/09; H10B 43/40; H10B 41/20; H10B 41/40; H10B 41/41; H10B 10/125; H10B 12/20; H10B 43/20; H10D 89/10; H10D 88/01; H10D 10/051; H10D 64/513; H10D 84/998; H10D 30/681; H10D 84/0172; H10D 30/0411; H10D 30/711; H10D 84/038; H10D 30/792; H10D 84/907; H10D 30/69; H10D 84/0186; H10D 30/0413; H10D 86/201; H10D 86/01; H10D 64/027; H10D 30/0512; H10D 84/85; H10D 30/60; G11C 5/06; G11C 8/16; G11C 5/025; H01L 21/76898; H01L 23/481; H01L 21/6835; H01L 21/76254; H01L 23/5252; H01L 21/743; H01L 23/544; H01L 21/02; H01L 21/265; H01L 2224/16225; H01L 2225/06589; H01L 2224/48227; H01L 2223/54426; H01L 2224/16145;

(Continued)

(56) References Cited

U.S. PATENT DOCUMENTS 5,882,987 A   3/1999   Srikrishnan
9,331,032 B2   5/2016   Liu et al.

(Continued)

OTHER PUBLICATIONS

Sasaki, Title: Delamination of Si by high dose H-ion implantation through thin SiO2 film (ESR characterization); Materials Science and Engineering: B; vols. 91-92, Apr. 2002, pp. 160-163, Apr. 30, 2002.

*Primary Examiner* — Mouloucoulaye Inoussa
(74) *Attorney, Agent, or Firm* — Winston Hsu

(57) ABSTRACT

A method for fabricating a semiconductor device includes the steps of providing a first wafer and a second wafer as the first wafer includes a device wafer and the second wafer includes a blanket wafer, bonding the first wafer and the second wafer, performing a thermal treatment process to separate the second wafer into a first portion and a second portion, and then planarizing the first portion.

20 Claims, 8 Drawing Sheets

(58) Field of Classification Search
CPC ... H01L 2924/1305; H01L 2221/68327; H01L 2924/13062; H01L 2924/30105; H01L 2224/83894; H01L 2924/01004; H01L 2924/01066; H01L 2924/01068; H01L 2924/01078; H01L 2924/12042; C01G 33/006; C01G 35/006; H10N 30/8542; H10N 30/088; H10N 30/072; C30B 31/22; C30B 29/30; B32B 9/005; B32B 37/18; B32B 38/10; B32B 17/06; B32B 38/0036; B32B 2250/02; B32B 2260/04; B32B 2307/20; B32B 2310/0806; B32B 2315/08; B32B 2260/02
See application file for complete search history.

(56) References Cited

U.S. PATENT DOCUMENTS

| | | | | |
|---|---|---|---|---|
| 2009/0098704 | A1* | 4/2009 | Ohnuma | H01L 21/76254 |
| | | | | 257/E21.567 |
| 2016/0035722 | A1* | 2/2016 | Or-Bach | H10D 62/83 |
| | | | | 257/504 |
| 2019/0214485 | A1* | 7/2019 | Wang | H01L 21/324 |
| 2021/0251211 | A1* | 8/2021 | Rashed | A01M 29/16 |
| 2023/0163128 | A1* | 5/2023 | Li | H10D 84/83 |
| | | | | 257/43 |

* cited by examiner

SEMICONDUCTOR DEVICE AND METHOD FOR FABRICATING THE SAME

BACKGROUND OF THE INVENTION

1. Field of the Invention

The invention relates to a method for fabricating semiconductor device, and more particularly to a method of bonding two wafers.

2. Description of the Prior Art

As the development of electronic products progresses, the demand for related components has increased as well. For example, as the development of digital cameras and scanners progresses, the demand for image sensor increases accordingly. In general, today's image sensors in common usage are divided into two main categories: charge coupled device (CCD) sensors and CMOS image sensors (CIS). The application of CMOS image sensors has increased significantly for several reasons. Primarily, CMOS image sensors have certain advantages of offering low operating voltage, low power consumption, and the ability for random access. Additionally, CMOS image sensors are currently capable of integration with the semiconductor fabrication process.

However in current approach of connecting wafers carrying semiconductor devices such as CMOS image sensors through hybrid bonding, chemical mechanical polishing (CMP) processes are often conducted to remove materials on backside of the wafer and this not only results in issues such as uneven flatness as well as misalignment during bonding. Hence, how to effectively improve these issues has become an important task in this field.

SUMMARY OF THE INVENTION

According to an embodiment of the present invention, a method for fabricating a semiconductor device includes the steps of providing a first wafer and a second wafer as the first wafer includes a device wafer and the second wafer includes a blanket wafer, bonding the first wafer and the second wafer, performing an anneal process to separate the second wafer into a first portion and a second portion, and then planarizing the first portion.

According to another aspect of the present invention, a semiconductor device includes a first wafer comprising a device wafer, a second wafer comprising a blanket wafer on the first wafer, an electrode layer on the second wafer, a dielectric layer around the second wafer and the electrode layer, and a first metal interconnection in the dielectric layer to connect the first wafer and the electrode layer.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
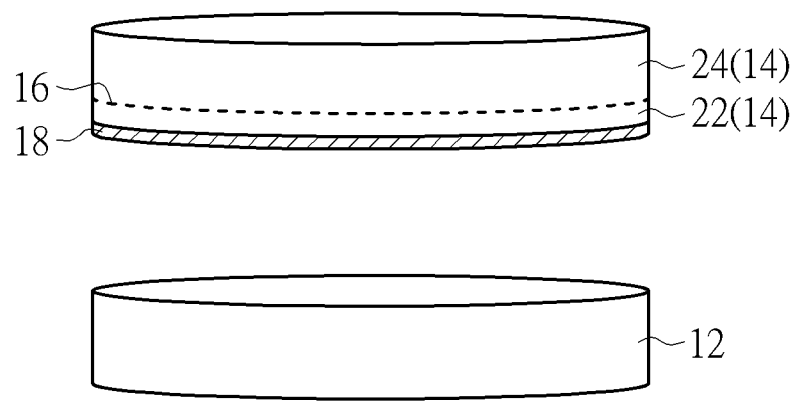
FIGS. 1-14 illustrate a method for fabricating semiconductor device according to an embodiment of the present invention.

Referring to FIGS. 1-14, FIGS. 1-14 illustrate a method for fabricating semiconductor device according to an embodiment of the present invention. As shown in FIG. 1, silicon wafers including a first wafer 12 and a second wafer 14 are provided, in which the first wafer 12 preferably includes a device wafer and the second wafer 14 includes a blanket wafer. Specifically, the first wafer 12 or device wafer includes a plurality of semiconductor device thereon including but not limited to for example active devices, passive devices, sensors, memories, or other semiconductor devices fabricated through multiple semiconductor processes, an insulating layer covering the semiconductor devices, and conductive wires or metal patterns used for connecting the semiconductor devices. The second wafer 14 or blanket wafer on the other hand could be a control wafer typically used for semiconductor process testing and no elements such as the semiconductor devices and/or metal patterns fabricated on the first wafer 12 is formed on the second wafer 14.

Next, an ion implantation process could be conducted to form a doped region 16 on the second wafer 14, and then an insulating layer 18 made of silicon oxide is formed on the bottom surface of the second wafer 14 to server as a barrier between the first wafer 12 and the second wafer 14 in the later process. In this embodiment, the ion implantation process preferably implants hydrogen atoms into the second wafer 14 at approximately half thickness or slightly less than half of the overall thickness of the second wafer 14. This forms a doped region 16 represented by the dotted line and separates the second wafer 14 into a first portion 22 and a second portion 24, in which both the first portion 22 and the second portion 24 do not include any hydrogen dopants.

Figure 2:
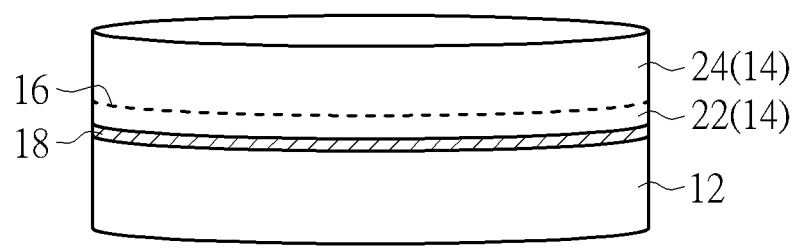

Next, as shown in FIG. 2, a bonding process is conducted to bond the first wafer 12 and the second wafer 14, in which the insulating layer 18 on the bottom surface of the second wafer 14 preferably contacts the top surface of the first wafer 12 directly.

Figure 3:
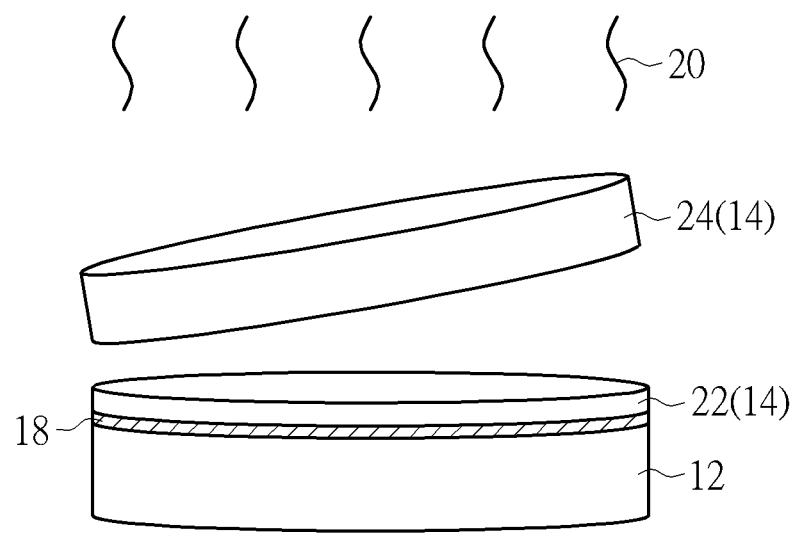

Next, as shown in FIG. 3, a thermal treat process 20 such as an anneal process is conducted by using a temperature between 300-400° C. to heat the two wafers 12, 14. According to a preferred embodiment of the present invention, after the two wafers 12, 14 are heated by the anneal process, the first portion 22 and the second portion 24 of the second wafer 14 are preferably separated from the dotted line, in which the first portion 22 is used for carrying out fabrications in the later process while the second portion 24 is recycled or discarded.

Figure 4:
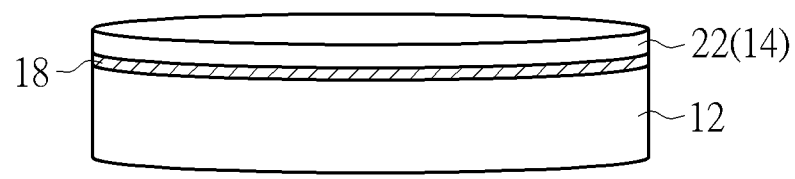

Next, as shown in FIG. 4, a planarizing process such as a chemical mechanical polishing (CMP) process is conducted to planarize the first portion 22 of the second wafer 14.

Figure 5:
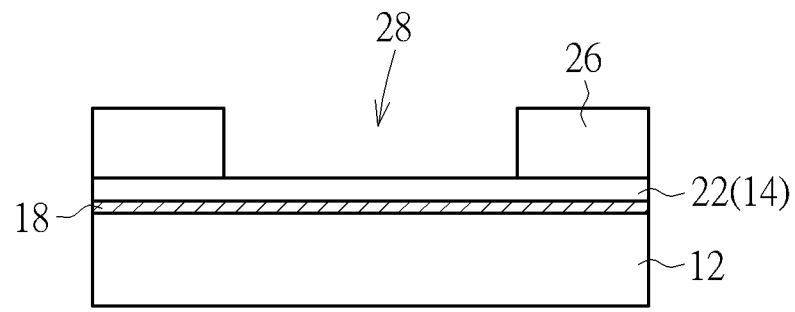

Next, as shown in FIG. 5, a patterned mask 26 such as a patterned resist is formed on the first portion 22, in which the patterned mask 26 includes an opening 28 exposing the surface of the first portion 22.

Figure 6:
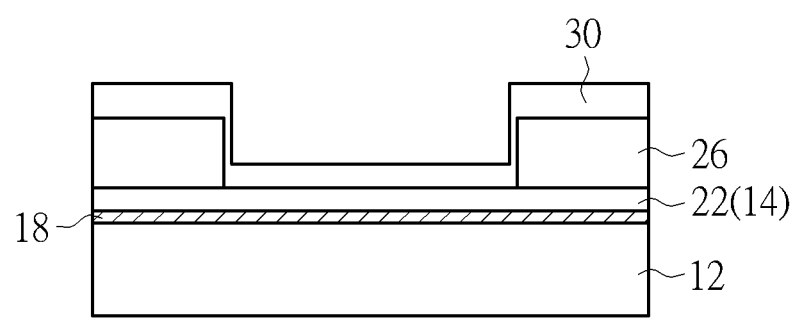

Next, as shown in FIG. 6, a deposition process is conducted to form an active layer 30 on the exposed first portion 22 surface of the second wafer 14 and on the patterned mask 26, in which sidewalls of the active layer 30 are aligned with sidewalls of the patterned mask 26. In this embodiment, the active layer 30 is preferably made of indium gallium zinc oxide (IGZO), but not limited thereto.

Figure 7:
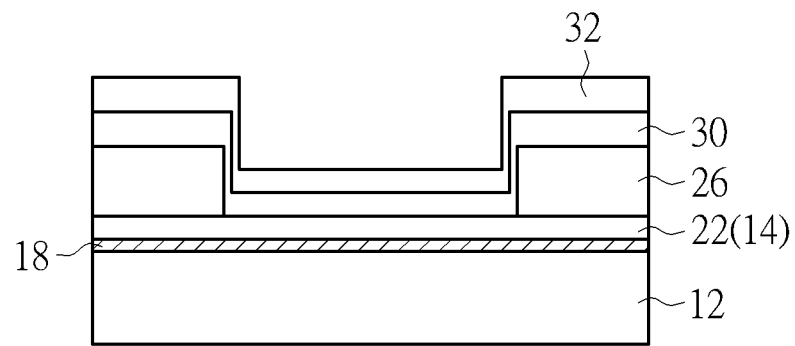

Next, as shown in FIG. 7, another deposition process is conducted to form an electrode layer on the active layer 30. Preferably, the electrode layer 32 in this embodiment is made of indium tin oxide (ITO), but not limited thereto.

Figure 8:
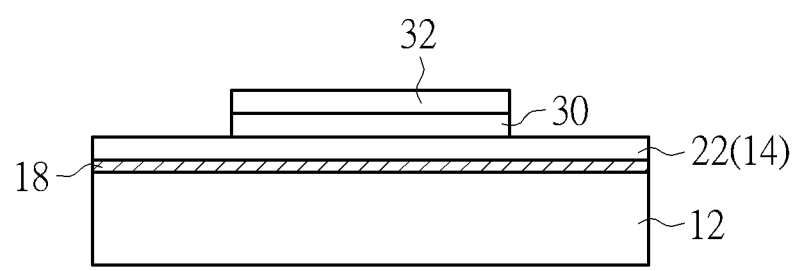

Next, as shown in FIG. 8, a lift-off process is conducted to remove the patterned mask 26 and at the same time form a patterned active layer 30 and patterned electrode layer 32 on the surface of the first portion 22. It should be noted that the lift-off process conducted this stage not only removes the patterned mask 26 completely but also removes part of the active layer 30 and electrode layer 32 directly on top of the patterned mask 26 so that the remaining or patterned active layer 30 and electrode layer 32 are disposed on substantial center location of the first portion 22 of the second wafer 14.

It should also be noted that even though only a single patterned active layer 30 and a single patterned electrode layer 32 are disposed in this embodiment, according to other embodiment of the present invention it would also be desirable to a plurality of patterned active layers 20 and a plurality of patterned electrode layers 32 on the second wafer 14 for fabricating multiple photosensors or photo sensing units, which is also within the scope of the present invention.

Figure 9:
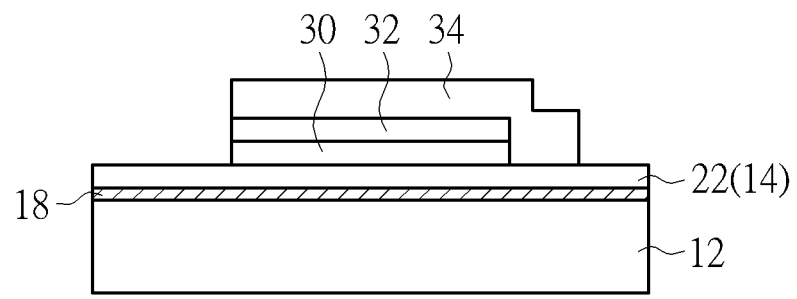

Next, as shown in FIG. 9, another patterned mask 34 such as a patterned resist or patterned dielectric layer is formed on the first portion 22 of the second wafer 14 and the electrode layer 32 while exposing part of the surface of the second wafer 14.

Figure 10:
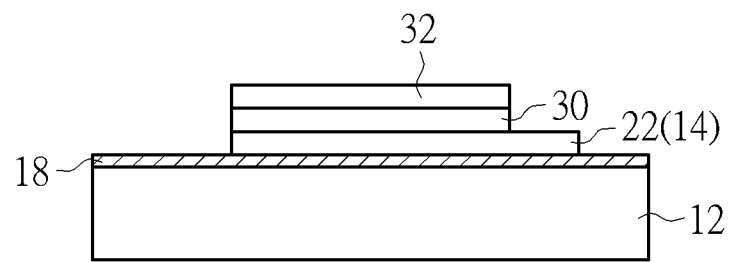

Next, as shown in FIG. 10, a photo-etching process is conducted by using the patterned mask 34 as mask to remove part of the first portion 22 for exposing the surface of the insulating layer 18, and the patterned mask 34 is removed thereafter. At this stage, the overall width of the second wafer 14 is now slightly less than the width of the first wafer 12 and one side such as the left side of the electrode layer 32 is aligned with sidewalls of the active layer 20 and the second wafer 14. It should be noted that even though none of the insulating layer 18 is removed during removal of part of the first portion 22, according to other embodiment of the present invention, it would also be desirable to remove part of the first portion 22 and part of the insulating layer 18 at the same time and exposing part of the surface of the first wafer 12, which is also within the scope of the present invention.

Figure 11:
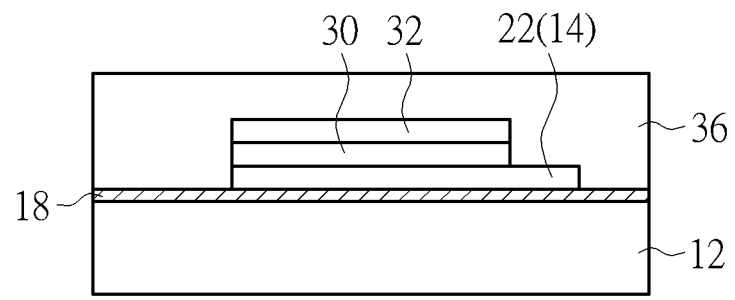

Next, as shown in FIG. 11, a dielectric layer 36 such as an interlayer dielectric (ILD) layer made of silicon oxide is formed on the first wafer 12 and the electrode layer 32 while surrounding the first portion 22 of the second wafer 14, the active layer 30, and the electrode layer 32. Preferably, sidewalls of the dielectric layer 36 are aligned with sidewalls of the first wafer 12.

Figure 12:
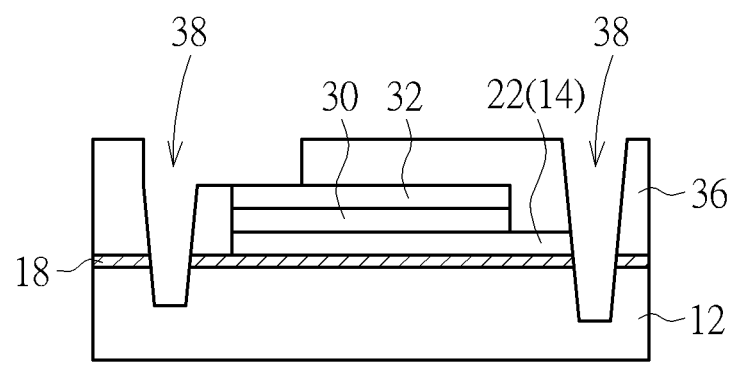

Next, as shown in FIG. 12, a photo-etching process is conducted to remove part of the dielectric layer 36, part of the insulating layer 18, and part of the first wafer 12 to form contact holes 38 exposing the top surface of part of the electrode layer 32 and part of the first wafer 12 adjacent to two sides of the electrode layer 32.

Figure 13:
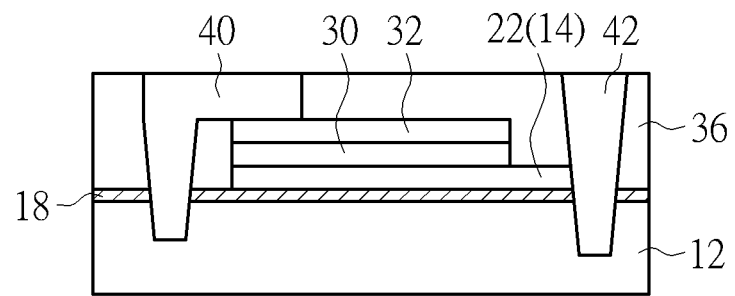

Next, as shown in FIG. 13, contact plugs or metal interconnections 40, 42 are formed in the contact holes 38 for connecting the first wafer 12 and the electrode layer 32, in which the metal interconnection 40 on left side of the electrode layer 32 preferably connects or directly contacts the electrode layer 32 and the first wafer 12 while the metal interconnection 42 on right side of the electrode layer 32 connects the sidewall of the second wafer 14 and the first wafer 12 underneath. Viewing from a cross-section perspective, the metal interconnection 40 on left side of the electrode layer 32 includes a L-shape while the metal interconnection 42 on right side of the electrode layer 32 includes an I-shape.

According to an embodiment of the present invention, conductive materials including a barrier layer selected from the group consisting of titanium (Ti), titanium nitride (TiN), tantalum (Ta), and tantalum nitride (TaN) and metal layer selected from the group consisting of tungsten (W), copper (Cu), aluminum (Al), titanium aluminide (TiAl), and cobalt tungsten phosphide (CoWP) could be deposited into the contact holes, and a planarizing process such as CMP could be conducted to remove part of the conductive materials including the aforementioned barrier layer and metal layer to form metal interconnections 40, 42.

Figure 14:
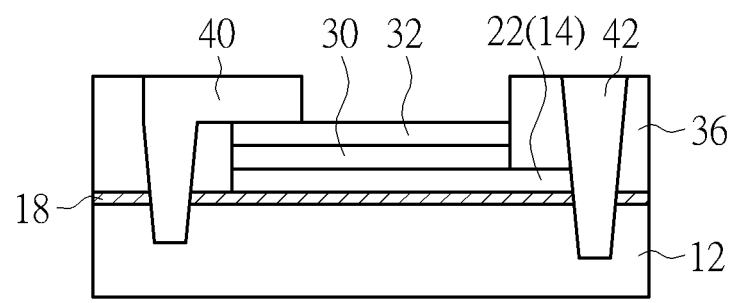

Next, as shown in FIG. 14, another photo-etching process could be conducted to remove part of the dielectric layer 36 directly on top of the electrode layer 32 for exposing the top surface of the electrode layer 32. This completes the fabrication of a semiconductor device according to an embodiment of the present invention.

Figure 15:
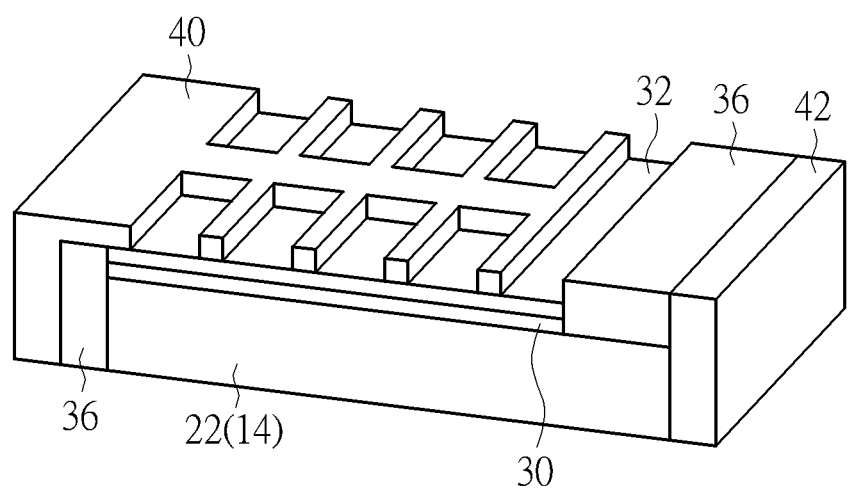
FIG. 15 illustrates a partial 3-dimensional structural view of FIG. 14 according to an embodiment of the present invention.

Referring to FIG. 15, FIG. 15 illustrates a partial 3-dimensional structural view of FIG. 14 according to an embodiment of the present invention. As shown in FIG. 15, in contrast to only forming a photosensor made of a single active layer 30 and an electrode layer 32 on the second wafer 14 in aforementioned embodiment, it would also be desirable to form a plurality of photosensors or photo sensing units arranged in arrays on the second wafer 14 when the electrode layer 32 and the active layer 30 are patterned. Preferably, each of the photosensors could be defined by the gridline pattern metal interconnections 40 while each of the photosensors could include patterned or un-patterned electrode layer 32 and active layer 30. It should also be noted that the metal interconnection 40 shown on left side of FIG. 14 is preferably presented by the gridline pattern metal interconnection 40 shown in FIG. 15, in which the gridline pattern metal interconnection 40 is disposed on top of the electrode layer 32 and active layer 30 and connecting to the first wafer 12 (not shown). The metal interconnection 42 shown on right side of FIG. 14 on the other hand is also connected to the first wafer 12 on lower level through sidewall of the second wafer 14.

Overall, the present invention discloses an approach for integrating device wafer and blanket wafer by first providing a first wafer such as a device wafer and a second wafer such as a blanket wafer while part of the second wafer includes a doped region made of hydrogen ions, and then performing a thermal treatment process to separate the doped portion and non-doped portion of the second wafer so that substrate used for forming electrode patterns and/or wirings in the later process could be fabricated. Afterwards, conductive patterns such as active layer made of IGZO and electrode layer made of ITO could be formed on the two wafers depending on the demand of the process, a dielectric layer could be formed to cover the conductive patterns, and metal interconnections could be formed in the dielectric layer to electrically connect the conductive patterns and the two wafers. By using this approach to bond the two wafers, it would be desirable to improve flatness on backside of the wafer and lower influences on the two wafers during low thermal budget environment such as an environment lower than 300° C.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating a semiconductor device, comprising:
   providing a first wafer and a second wafer, wherein the first wafer comprises a device wafer and the second wafer comprises a blanket wafer;
   bonding the first wafer and the second wafer;
   performing a thermal treatment process to separate the second wafer into a first portion and a second portion;
   planarizing the first portion;
   forming a first patterned mask on the first portion; and
   depositing an active layer to cover the first portion and the first patterned mask.

2. The method of claim 1, further comprising:
   forming a doped region in the second wafer;
   forming an insulating layer under the second wafer;
   bonding the first wafer and the insulating layer;
   performing the thermal treatment process to remove the second portion; and
   planarizing the first portion.

3. The method of claim 2, wherein the doped region comprises hydrogen.

4. The method of claim 2, further comprising:
   forming an electrode layer on the active layer;
   lifting off the first patterned mask;
   patterning the first portion;
   forming a dielectric layer around the first portion, the active layer, and the electrode layer;
   forming a first metal interconnection in the dielectric layer to connect the first wafer and the electrode layer; and
   forming a second metal interconnection in the dielectric layer to connect the first portion.

5. The method of claim 4, further comprising lifting off the electrode layer and the active layer on the first patterned mask and the first patterned mask at the same time.

6. The method of claim 4, wherein patterning the first portion comprises:
   forming a second patterned mask on the first wafer and the electrode layer; and
   removing a part of the first portion.

7. The method of claim 1, wherein the active layer comprises indium gallium zinc oxide (IGZO).

8. The method of claim 4, wherein the electrode layer comprises indium tin oxide (ITO).

9. The method of claim 4, wherein the first metal interconnection comprises a L-shape.

10. The method of claim 4, wherein the second metal interconnection comprises an I-shape.

11. A semiconductor device, comprising:
    a first wafer, wherein the first wafer comprises a device wafer;
    a second wafer on the first wafer, wherein the second wafer comprises a blanket wafer;
    an electrode layer on the second wafer;
    a dielectric layer around the second wafer and the electrode layer; and
    a first metal interconnection in the dielectric layer to directly contact the first wafer and the electrode layer.

12. The semiconductor device of claim 11, further comprising:
    an insulating layer between the first wafer and the second wafer; and
    an active layer between the first wafer and the electrode layer.

13. The semiconductor device of claim 12, wherein the active layer comprises indium gallium zinc oxide (IGZO).

14. The semiconductor device of claim 11, wherein the electrode layer comprises indium tin oxide (ITO).

15. The semiconductor device of claim 11, wherein a width of the second wafer is less than a width of the first wafer.

16. The semiconductor device of claim 11, wherein a thickness of the second wafer is less than a thickness of the first wafer.

17. The semiconductor device of claim 11, wherein a sidewall of the electrode layer is aligned with a sidewall of the second wafer.

18. The semiconductor device of claim 11, wherein the first metal interconnection comprises a L-shape.

19. The semiconductor device of claim 11, further comprising a second metal interconnection in the dielectric layer and connected to the second wafer.

20. The semiconductor device of claim 19, wherein the second metal interconnection comprises an I-shape.

* * * * *